US006565652B1

(12) United States Patent
Kononchuk et al.

(10) Patent No.: US 6,565,652 B1
(45) Date of Patent: May 20, 2003

(54) HIGH RESISTIVITY SILICON WAFER AND METHOD OF PRODUCING SAME USING THE MAGNETIC FIELD CZOCHRALSKI METHOD

(75) Inventors: Oleg V. Kononchuk, Brush Prairie, WA (US); Sergei V. Koveshnikov, Vancouver, WA (US); Zbigniew J. Radzimski, Brush Prairie, WA (US); Neil A. Weaver, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/010,014

(22) Filed: Dec. 6, 2001

(51) Int. Cl.⁷ .............................................. C30B 15/20
(52) U.S. Cl. .............................. 117/32; 117/13; 117/30
(58) Field of Search ............................... 117/13, 30, 32, 117/84, 89

(56) References Cited

U.S. PATENT DOCUMENTS

| 4,910,156 | A | | 3/1990 | Takasu et al. |
| 5,359,959 | A | | 11/1994 | Fusegawa et al. |
| 6,117,231 | A | * | 9/2000 | Fusegawa et al. ............ 117/30 |
| 6,191,009 | B1 | * | 2/2001 | Tamatsuka et al. ......... 438/471 |
| 6,224,668 | B1 | | 5/2001 | Tamatsuka |

FOREIGN PATENT DOCUMENTS

EP     1 087 041 A1     3/2001

* cited by examiner

Primary Examiner—Felisa Hiteshew
(74) Attorney, Agent, or Firm—Alston & Bird LLP

(57) ABSTRACT

An improved method of obtaining a wafer exhibiting high resistivity while preventing the reduction of resistivity due to the generation of oxygen donors provided by: a) using the CZ method to grow a silicon single crystal ingot in the presence of a magnetic field, such crystal having a resistivity of 100 Ω·cm or more and an initial interstitial oxygen concentration of 5 to 10 ppma and b) processing the ingot into a wafer.

11 Claims, 1 Drawing Sheet

HIGH RESISTIVITY SILICON WAFER AND METHOD OF PRODUCING SAME USING THE MAGNETIC FIELD CZOCHRALSKI METHOD

FIELD OF THE INVENTION

The present invention relates to a method of producing a high-resistivity silicon wafer. More particularly, the present invention relates to a method of producing a high-resistivity silicon wafer by a magnetic field Czochralski method which exhibits minimal change in resistivity upon heat treatment during device processing.

BACKGROUND OF THE INVENTION

High resistivity silicon wafers have conventionally been used for power devices such as high-voltage power devices and thyristors. More recently, C-MOS devices, Schottky barrier diodes, and other semiconductor devices for use in mobile communications have been developed which require the use of high-resistivity silicon wafers. The high-resistivity wafers tend to decrease the effects of parasitic capacity among the devices of the wafer, allowing the devices to be more closely packed upon the surface of the wafer while, at the same time, reducing signal transmission loss among the devices.

High-resistivity wafers are generally defined as those silicon wafers with resistivity of 100 Ω·cm or greater, and typically have resistivity of 1000 Ω·cm or greater. The initial resistivity of a wafer is established during crystal growth by the precise addition of dopants to the molten polysilicon from which the silicon crystal is formed. By doping, the resistivity of the crystals can be controlled within close tolerances. However, the initial resistivity may be altered, desirably or undesirably, during subsequent processing of the wafer such that the final resistivity of the wafer may be very different from the resistivity directly after crystal growth.

In order to form more devices from a single wafer and therefore reduce the cost per device, larger wafers are generally preferred. As such, while high resistivity silicon wafers may be fabricated by a float zone technique, the limitations on size of the resulting wafers make the Czochralski (CZ) crystal growing method the desired fabrication technique. The CZ method allows wafers having diameters of 200 mm, 300 mm, 400 mm, or larger to be produced. In addition to the large wafer diameter, the CZ method also provides wafers with excellent planar resistivity distribution and lower cost. Good planar resistivity distribution means that the wafer has only minimal variations in resistivity along the plane which was perpendicular to the direction of pull of the crystal during crystal growth.

Unfortunately, there are some problems related to the presence of oxygen during the growth of high-resistivity silicon wafers in a CZ apparatus. During crystal growth within a CZ apparatus, oxygen from the quartz crucible tends to be introduced into the silicon crystal and is maintained in the interstitial spaces of the silicon crystal lattice. The interstitial oxygen atoms are normally electrically neutral, but the oxygen atoms tend to agglomerate as oxygen-containing thermal donors (OTDs), which become electron donors when subjected to heat in the range of 350° C. to 500° C. Thus, the resistivity of the wafer may be unfavorably decreased by a relatively mild heating due to the contribution of electrons from the OTDs residing in the wafer. The decrease in resistivity due to the oxygen is especially problematic considering that temperatures in the range of 350° C. to 500° C. are commonly encountered during process steps subsequent to wafer fabrication, such as during device fabrication.

The elimination of oxygen from the silicon lattice is not a complete solution to the problem of resistivity variation within a silicon wafer. The presence of oxygen within the silicon crystal causes oxygen precipitate bulk defects to form within the crystal. Though large numbers of bulk defects are not desired, small numbers of bulk defects contribute to a gettering effect within the crystal. By gettering, the defects within the crystal act to trap mobile ionic contamination and to prevent the contamination from traveling to the surface of the wafer. The gettering is necessary to protect the devices on the surface of the wafer from interference from the contaminants.

As described in European Patent Office publication EP 1087041 A1, incorporated herein by reference, there is known a method of producing a high-resistivity wafer having a high gettering effect while preventing the reduction of resistivity due to electrons being donated from OTDs upon subsequent heating cycles of the wafer. The method includes first producing a single crystal ingot having a resistivity of 100 Ω·cm or greater and an initial interstitial oxygen concentration of 10 to 25 parts per million atomic (ppma) by a CZ method. Interstitial oxygen is then precipitated with a gettering heat treatment step until the residual interstitial oxygen concentration in the wafer becomes about 8 ppma or less. The precipitated oxygen does not have the ability to donate electrons like the OTDs formed from the interstitial oxygen so subsequent heat treating process do not result in a reduction in resistivity.

The gettering heat treatment is capable of reducing the oxygen content of a 100 Ω·cm wafer from 10 to 25 ppma to 8 ppma or less while generating or maintaining a bulk defect density of $1 \times 10^8$ to $2 \times 10^{10}$ defects/cm$^3$. This number of defects is sufficient to provide gettering to the wafer, in order to trap contaminants and prevent the contaminants from moving to the surface of the wafer. The wafer described above will maintain high resistivity through subsequent low temperature heat treatments, such as device heat treatments at 350° C. to 500° C., while maintaining sufficient gettering effect.

The main drawback with the above described gettering heat treatment, however, is the process time required to precipitate the oxygen within the wafer. Typically, for example, the heat treatment process may require a first heating step of 800° C. for 4 hours, a second heat treating step of 1000° C. for 10 hours, and a third heat treatment step of 1050° C. for 6 hours. The extended process time required to maintain the wafer at temperature until the oxygen content of the wafer is reduced from 10 to 25 ppma to 8 ppma or less lowers the overall efficiency of the wafer making process, both in terms of time and in terms of power requirements.

What is needed is a method of accurately controlling the amount of oxygen which is allowed to enter the silicon crystal during growth of the high-resistivity silicon crystal ingot. By controlling the amount of oxygen present in the crystal, the need to alter the oxygen content by using heat treatment is minimized.

SUMMARY OF THE INVENTION

The invention is a method of forming a high-resistivity silicon wafer containing low levels of interstitial oxygen such that the oxygen does not form significant numbers of oxygen thermal donors (OTDs) upon heat treatments experienced during device fabrication, thereby preventing the resistivity of the wafer from diminishing after wafer fabrication.

An improved method of obtaining a wafer exhibiting high resistivity while preventing the reduction of resistivity due to the generation of OTDs is provided by: a) using the CZ method to grow a silicon single crystal ingot in the presence of a magnetic field, such crystal having a resistivity of 100 Ω·cm or more and an initial interstitial oxygen concentration of 5 to 10 ppma and b) processing the ingot into a wafer.

The resulting wafer has high resistivity, and the very low initial interstitial oxygen content of 5 to 10 ppma prevents the oxygen constituents from becoming electrically active thermal donors upon subsequent heat treatments of the silicon wafer, such as during device fabrication. Thus, a consistent wafer resistivity may be maintained without undue change caused by undesirable electron donation from interstitial oxygen content within the wafer. Growth of the crystal using a MCZ method lowers the initial concentration of oxygen to a desired level and allows for the relatively precise control of oxygen content within the wafer without requiring an extensive heat treatment as required by conventional processes.

BRIEF DESCRIPTION OF THE DRAWINGS

Figure 1:
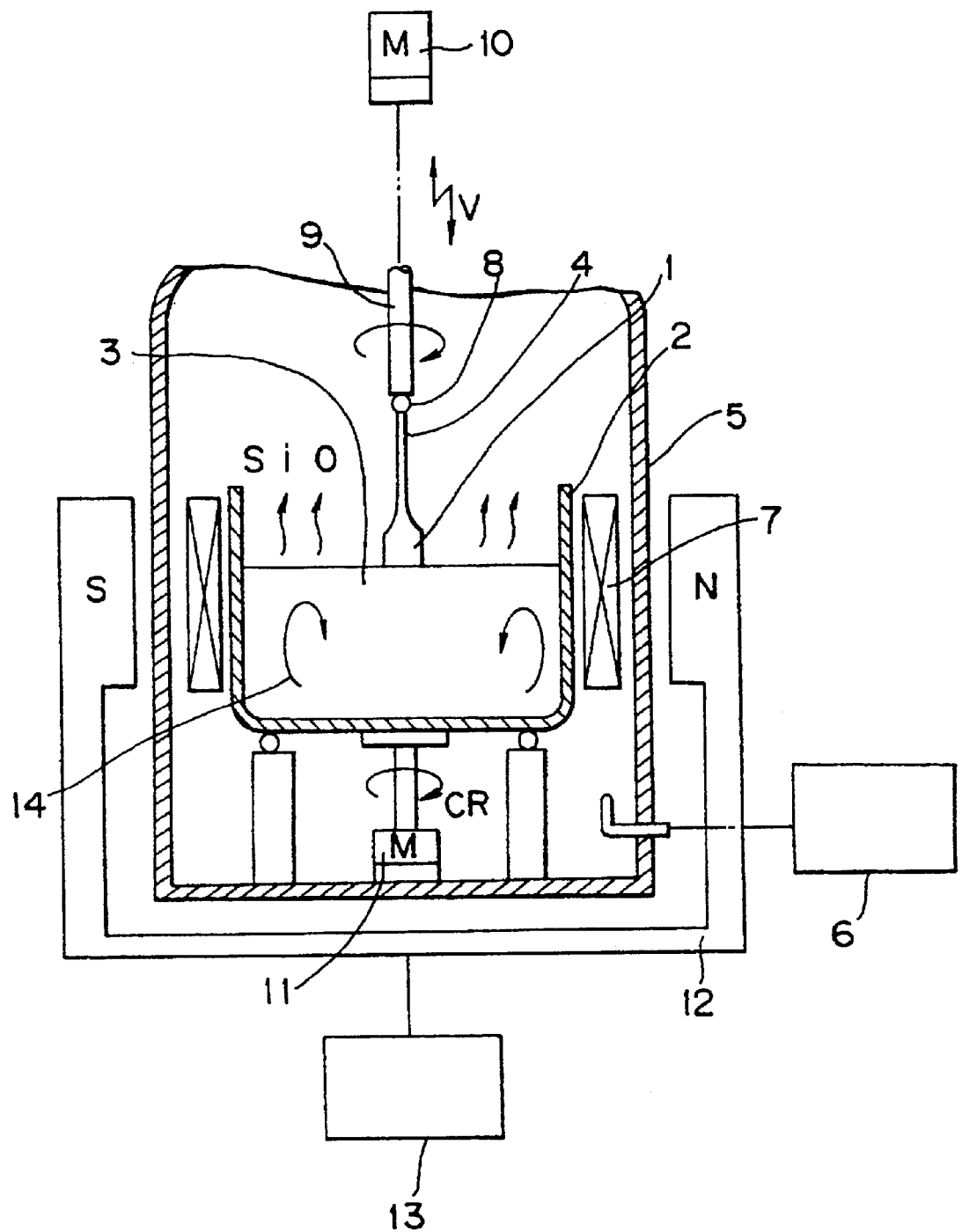

Having thus described the invention in general terms, reference will now be made to the accompanying drawing, which is not necessarily drawn to scale, and wherein:

FIG. 1 illustrates an exemplary apparatus capable of supplying a magnetic field during the growth of a silicon crystal by Czochralski method.

DETAILED DESCRIPTION OF THE INVENTION

The present invention now will be described more fully hereinafter with reference to the accompanying drawing. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

An improved method of obtaining a wafer exhibiting high resistivity while preventing the reduction of resistivity due to the generation of oxygen thermal donors (OTDs) is provided by: a) using the CZ method to grow a silicon single crystal ingot in the presence of a magnetic field, such crystal having a resistivity of 100 Ω·cm or more and an initial interstitial oxygen concentration of about 7 to about 10 ppma and b) processing the ingot into a wafer. In an embodiment of the invention, the grown crystal ingot has an initial interstitial oxygen concentration of about 5 or about 6 ppma.

The resulting wafer has high resistivity, and a very low amount of initial interstitial oxygen content which prevents the oxygen constituents from becoming electrically active electron donors upon subsequent heat treatments of the silicon wafer, such as during device fabrication. Thus, a consistent wafer resistivity may be maintained without undue change caused by undesirable electron donation from oxygen content within the wafer.

By subjecting the crystal to a strong magnetic field during the growth of the crystal, the oxygen which is allowed to enter the interstitial spaces of the silicon crystal lattice during growth of the lattice is reduced. So, the oxygen required to be precipitated via heat treatment is reduced, thereby simplifying the heat treatment process, if any, both in terms of time and power requirements. Also, target values of initial oxygen concentration may be achieved by utilizing different strengths of magnetic fields.

The general method of growing silicon ingots according to the CZ method and thereafter slicing the ingots into silicon wafers is known in the art. General reference on performing the CZ method is provided by Ullmann's Encyclopedia of Industrial Chemistry, vol. A23, p.727–731 (1993) and further by Van Zant, Peter, Microchip Fabrication, Fourth Edition, p.53–55 (2000).

U.S. Pat. No. 5,359,959, incorporated herein by reference, discloses an exemplary method of applying a magnetic field during crystal growth in a CZ chamber. FIG. 1 illustrates an outline construction of an exemplary magnetic field Czochralski (MCZ) device to be used for the growth of a semiconductor single crystal ingot 1. Inert gas 6 is supplied at a prescribed flow rate into a hermetically closed furnace 5. The inert gas is released through an unshown discharge outlet as accompanied by the gaseous SiO generated within the hermetically closed furnace 5. A quartz crucible 2 possessing a shape open at the top is disposed substantially at the center of the hermetically closed furnace 5. Silicon thermally melted by heating means 7 disposed around the quartz crucible 2 is held as a melt 3 in the quartz crucible 2. A seed crystal 4 of silicon is disposed as posed in contact with the surface of the melt 3 of silicon. The seed crystal 4 is connected to a rotary shaft 9 rotated by a motor 10 through the medium of a pull-up chuck 8. The rotary shaft 9 is rotated by the motor 10 and, at the same time, pulled up at a fixed low speed v by unshown lifting means. The quartz crucible 2 is rotatably supported on the bottom surface of the hermetically closed furnace 2 and rotated at a fixed low speed (represented as "CR") by a motor 11. This speed is desirably selected in the range of 0 to 3 rpm.

Magnetic field generating means 12 formed as of an electromagnet and adapted to vary the intensity of a magnetic field as with a direct current I is disposed outside the hermetically closed furnace 5. An electric current source for supplying the electric current I to the magnetic field generating means 12 is denoted as 13.

The single crystal ingot 1 of silicon is formed by keeping the quartz crucible 2 and the seed crystal 4 rotated at a fixed low speed and pulling up the seed crystal 4 held in contact with the surface of the melt 3 at a low speed v in the direction of pull-up. Since the quartz crucible 2 and the melt 3 are in contact with each other along the inner wall of the quartz crucible as illustrated in FIG. 1, friction occurring as a result of this contact to rub the quartz crucible 2 and dissolve oxygen out of the quartz crucible 2 into the melt 3.

The oxygen which has been dissolved into the melt 3 is combined with Si to form volatile SiO, which is released from the melt 3 and removed as entrained by the inert gas. Since the part of oxygen which has escaped being released and removed in the form of SiO persists in the melt 3, the single crystal ingot 1 of silicon is not perfectly purified but is suffered to contain oxygen. Since the oxygen which is contained in the single crystal ingot 1 of silicon consists mainly of interstitial oxygen, the oxygen concentration in the single crystal of silicon can be substantially found by determination of the interstitial oxygen concentration (Oi). Since the amount of the oxygen which mingles into the melt 3 is proportional to the degree with which the melt rubs the inner wall of the quartz crucible 2, this amount is decreased by decreasing the amount of the silicon melt.

The magnetic field generator 12 is disposed around the quartz crucible 2 so as to exert magnetic force upon the melt 3. When the speed of revolution, CR, of the quartz crucible 2 is small, an increase in the intensity of the magnetic field represses the convection 14 which occurs in melt 3 and decreases the dissolution of oxygen from the quartz crucible 2 side. When the speed of revolution, CR, exceeds a certain level, an increase in the intensity of the magnetic field, though serving to repress the convection, enhances the apparent viscosity due to the applied magnetic field and consequently augments the friction between the inner wall of the quartz crucible 2 and the melt 3 and conversely increases the amount of dissolved oxygen. The threshold value of the speed of revolution of the quartz crucible falls in the range of from 0 to 3 rpm. This threshold value decreases as the diameter of the quartz crucible increases and it also varies with the condition of the magnetic field.

The majority of interstitial oxygen within a silicon crystal originates from the quartz crucible containing the polysilicon melt material. Oxygen from the surface of the quartz crucible surface is dissolved into the polysilicon which crystallizes to form the crystal silicon ingot. Once crystallized, the oxygen is trapped as interstitial particles within the lattice of the silicon lattice.

By applying a strong magnetic field to the molten polysilicon material within the quartz crucible during growth of a crystal according to the CZ method, the amount of convection of the molten polysilicon within the crucible is reduced. Because convection is reduced, polysilicon material which resides near the surface of the crucible and which absorbs substantial amounts of oxygen remains near the surface of the crucible rather than being transported by convection throughout the volume of the polysilicon. Since the polysilicon material having relatively high oxygen content is maintained at the polysilicon and quartz interface, the gradient of oxygen concentration is reduced and the overall transfer of oxygen into the polysilicon is reduced.

The amount of oxygen which enters the melt may be controlled somewhat by the strength of the magnetic field applied to the polysilicon. Thus, by optionally varying the magnetic field during the pulling of the crystal, the change in oxygen content usually observed along the length of the crystal can be counteracted, so that the resulting crystal ingot has a constant oxygen content along its length. More specifically, a strong magnetic field is applied to the crucible and polysilicon material during the beginning portion of pulling the crystal, and the strength of the magnetic field is gradually decreased as the crystal is pulled to greater and greater lengths.

After production of the silicon crystal with the MCZ process, the amount of interstitial oxygen residing within the silicon crystal is between about 7 ppma and 10 ppma. It has been found that silicon materials having an initial interstitial oxygen concentration of between about 7 ppma and about 15 ppma and particularly between about 10 ppma and 15 ppma do not tend to precipitate oxygen properly. The MCZ may be used to reduce the initial interstitial oxygen concentration of the silicon to between about 7 ppma and about 10 ppma. Preferably, the initial interstitial oxygen concentration is about 5 or about 6 ppma.

To further reduce the oxygen supplied to the crystal as it is growing, a sintered or synthetic quartz crucible may be used in place of a pure quartz crucible. Alternatively, a barium coated quartz crucible may be used. Each of these alternatives supplies less oxygen to the silicon melt during a crystal growing process than that of a natural quartz crucible. After completion of crystal growth, the grown crystal ingot is sliced into wafers using techniques commonly available in the art of silicon wafer processing.

Because the amount of interstitial oxygen is below about 10 ppma after growth of the crystal according to the invented MCZ method, a oxygen precipitation heat treatment step is not required in order to minimize the formation of OTDs.

In silicon wafer production, favorable qualities associated with high resistivity are typically encountered at resistivities above about 1000 Ω·cm. Resistivity may certainly be higher than 1000 Ω·cm and may be tailored to the demands imposed by a subsequent device fabrication process. Initial wafer resistivity is determined by the precise addition of dopants during growth of the crystal ingot. Methods of producing a silicon crystal ingot with a particular initial resistivity are known in the art.

While the wafers described hereinabove may serve as the substrate for subsequent device fabrication, the high-resistivity wafers may optionally be utilized as base layers, or as both layers, in the production of silicon on insulation (SOI) wafers. In SOI production, a thin upper "bond" layer formed of a thin silicon wafer having very few defects is placed atop a "base" layer formed of a thicker silicon wafer. The two layers are fused together with an insulating material, usually a thin layer of oxide film. When used as a base layer in an SOI wafer, the high resistivity wafer reduces signal transmission loss, which is especially useful with high frequency devices. Optionally, in production of the SOI wafer, heat treatment required to fuse the bond layer to the base layer with the thin oxide layer may also serve as an oxygen precipitation heat treatment of the base layer. In this manner, the effect of the heat treatment required to fuse the bond layer to the base layer may be considered when determining the final amount of oxygen precipitation and the final amount of interstitial oxygen remaining after bonding of the base and bond layers.

An epitaxial layer may optionally be deposited upon a surface of the high resistivity wafer prior to device fabrication. Deposition of the epitaxial layer provides an overall wafer having a high resistivity, a defect free surface, and a bulk portion with low interstitial oxygen content. A silicon wafer treated in accordance with the invented method exhibits an interstitial oxygen concentration of 8 ppma or less. Since the interstitial oxygen does not favorably contribute to the gettering ability of the wafer material, the residual interstitial content is preferably about 5 or about 6 ppma.

After treatment in accordance with this invention, any subsequent heat treatment of the silicon wafer between about 350° C. and 500° C. will result in negligible change in resistivity of the wafer. This temperature range is important, because it is a common range of temperatures experienced during device fabrication heat treatment, collectively referring to the various heat treatments used in the device fabrication process, such as electrode wiring. By eliminating resistivity change subsequent to wafer fabrication, microchip producers can easily predict the resistivity of the wafer after device fabrication. In wafers of the prior art, resistivity of the silicon wafer would change with each device production heat treatment step, making final resistivity difficult to predict and similarly making device performance somewhat hard to predict.

In accordance with the present invention, oxygen precipitation heat treatment steps are not required in order to minimize change in resistivity upon heating during device fabrication. Thus, energy use and time delays required for the oxygen precipitation heat treatment required in previous processing methods are not required in accordance with this invention.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for producing a silicon wafer which retains high-resistivity throughout device fabrication heat treatment, comprising:
   growing a silicon single crystal ingot having a resistivity of 100 Ω·cm or more and an initial interstitial oxygen concentration of about 5 to about 10 ppma by the Czochralski method in the presence of a magnetic field and
   processing the silicon single crystal ingot into a wafer.

2. A method for producing a silicon wafer which retains high-resistivity throughout device fabrication heat treatment, comprising:
   growing a silicon single crystal ingot having a resistivity of 1000 Ω·cm or more and an initial interstitial oxygen concentration of about 5 to about 10 ppma by the Czochralski method in the presence of a magnetic field; and
   processing the silicon single crystal ingot into a wafer.

3. The method of claim 1, wherein the magnetic field is varied during the step of growing the silicon crystal ingot.

4. The method of claim 1, wherein the step of growing a silicon crystal ingot comprises growing an ingot having an initial interstitial oxygen concentration of about 5 to about 6 ppma.

5. A method for producing a silicon wafer which retains high-resistivity throughout device fabrication heat treatment, comprising:
   growing a silicon single crystal ingot having a resistivity of 100 Ω·cm or more and an initial interstitial oxygen concentration of about 5 to about 10 ppma by the Czochralski method in the presence of a magnetic field;
   processing the silicon single crystal ingot into a wafer wherein the high-resistivity wafer has opposed first and second surfaces, and
   bonding a second silicon wafer to the first surface of the high-resistivity wafer to form a single silicon on insulation (SOI) wafer.

6. The method of claim 5, wherein the high-resistivity wafer and the second silicon wafer are bonded by a thin oxide film disposed between the wafers.

7. A method for producing a silicon wafer which retains high-resistivity throughout device fabrication heat treatment, comprising:
   growing a silicon single crystal ingot having a resistivity of 100 Ω·cm or more and an initial interstitial oxygen concentration of about 5 to about 10 ppma by the Czochralski method in the presence of a magnetic field;
   processing the silicon single crystal ingot into a wafer wherein the high-resistivity wafer has opposed first and second surfaces, and
   depositing an epitaxial layer upon the first surface of the high-resistivity wafer.

8. A method for producing a silicon wafer which retains high-resistivity throughout device fabrication heat treatment, comprising:
   growing a silicon single crystal ingot having a resistivity of 100 Ω·cm or more and an initial interstitial oxygen concentration of about 5 to about 10 ppma by the Czochralski method in the presence of a magnetic field; and
   processing the silicon single crystal ingot into a wafer;
   wherein the step of growing the single crystal silicon ingot takes place in a sintered quartz crucible.

9. A method for producing a silicon wafer which retains high-resistivity throughout device fabrication heat treatment, comprising:
   growing a silicon single crystal ingot having a resistivity of 100 Ω·cm or more and an initial interstitial oxygen concentration of about 5 to about 10 ppma by the Czochralski method in the presence of a magnetic field; and
   processing the silicon single crystal ingot into a wafer;
   wherein the step of growing the single crystal silicon ingot takes place in a synthetic quartz crucible.

10. A method for producing a silicon wafer which retains high-resistivity throughout device fabrication heat treatment, comprising:
    growing a silicon single crystal ingot having a resistivity of 100 Ω·cm or more and an initial interstitial oxygen concentration of about 5 to about 10 ppma by the Czochralski method in the presence of a magnetic field; and
    processing the silicon single crystal ingot into a wafer;
    wherein the step of growing the single crystal silicon ingot takes place in a barium coated quartz crucible.

11. A method for producing a silicon wafer which retains high-resistivity throughout device heat treatment, comprising:
    growing a silicon single crystal ingot having a resistivity of 100 Ω·cm or more and an initial interstitial oxygen concentration of between about 5 and about 10 ppma by the Czochralski method while subjecting the growing crystal to a magnetic field,
    processing the silicon single crystal ingot into a high-resistivity wafer having an upper surface and a lower surface,
    contacting a second silicon wafer to the upper surface of the high-resistivity wafer via a thin oxide film, and
    heating the wafers, thereby
    bonding the high-resistivity wafer and second wafer to form a single silicon on insulation (SOI) wafer.

* * * * *

UNITED STATES PATENT AND TRADEMARK OFFICE
CERTIFICATE OF CORRECTION

PATENT NO. : 6,565,652 B1
DATED : May 20, 2003
INVENTOR(S) : Kononchuk et al.

It is certified that error appears in the above-identified patent and that said Letters Patent is hereby corrected as shown below:

<u>Title page,</u>
Under Item [57], ABSTRACT, "11 Claims" should read -- 8 Claims --.

<u>Column 7,</u>
Cancel claim 1;
Line 27, "2." should read -- 1. --;
Cancel claims 3 and 4;
Line 42, "5." should read -- 2. --;
Line 56, "6." should read -- 3. -- and "claim 5" should read -- claim 2 --;
Line 59, "7." should read -- 4. --.

<u>Column 8,</u>
Line 9, "8." should read -- 5. --;
Line 21, "9." should read -- 6. --;
Line 33, "10." should read -- 7. --;
Line 45, "11." should read -- 8. --.

Signed and Sealed this

Ninth Day of December, 2003

JAMES E. ROGAN
*Director of the United States Patent and Trademark Office*